United States Patent
Chen et al.

(10) Patent No.: US 9,349,477 B2
(45) Date of Patent: May 24, 2016

(54) INTER-CELL INTERFERENCE ESTIMATION BASED ON A PATTERN DEPENDENT HISTOGRAM

(71) Applicant: Seagate Technology LLC, Cupertino, CA (US)

(72) Inventors: Zhengang Chen, San Jose, CA (US); Yunxiang Wu, Cupertino, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 128 days.

(21) Appl. No.: 14/305,293

(22) Filed: Jun. 16, 2014

(65) Prior Publication Data

US 2015/0364205 A1 Dec. 17, 2015

(51) Int. Cl.
| | |
|---|---|
| G06F 12/00 | (2006.01) |
| G11C 16/34 | (2006.01) |
| G11C 16/26 | (2006.01) |
| G11C 16/10 | (2006.01) |
| G11C 16/08 | (2006.01) |
| G06F 12/02 | (2006.01) |

(52) U.S. Cl.
CPC ............ *G11C 16/3427* (2013.01); *G11C 16/08* (2013.01); *G11C 16/10* (2013.01); *G11C 16/26* (2013.01); *G06F 12/0246* (2013.01)

(58) Field of Classification Search
None
See application file for complete search history.

(56) References Cited

U.S. PATENT DOCUMENTS

| | | | | |
|---|---|---|---|---|
| 8,493,791 | B2 | 7/2013 | Karakulak et al. | 365/185.18 |
| 8,599,619 | B2 | 12/2013 | Fukuda | 365/185.21 |
| 2011/0145487 | A1 | 6/2011 | Haratsch et al. | 711/103 |
| 2013/0163328 | A1 | 6/2013 | Karakulak et al. | |
| 2013/0343131 | A1 | 12/2013 | Wu et al. | 365/185.24 |
| 2014/0112076 | A1 | 4/2014 | Ish-Shalom et al. | 365/185.18 |
| 2014/0112077 | A1 | 4/2014 | Ish-Shalom et al. | 365/185.18 |
| 2014/0133225 | A1 | 5/2014 | Zeng et al. | 365/185.03 |
| 2014/0136924 | A1 | 5/2014 | Zeng et al. | 714/764 |

OTHER PUBLICATIONS

Berman et al., "Error Correction Scheme for Constrained Inter-Cell Interference in Flash Memory", © Mar. 2011, UCSD, p. 1-20.*
Li, "WOM codes against inter-cell interference in NAND memories", © 2011 IEEE, p. 1416-1423.*

* cited by examiner

*Primary Examiner* — Brian Peugh
(74) *Attorney, Agent, or Firm* — Christopher P. Maiorana, PC (57) ABSTRACT

An apparatus comprising a memory and a controller. The memory may be configured to process a plurality of read/program operations. The memory may comprise a plurality of memory units each having a size less than a total size of the memory. The controller may be configured to perform a plurality of reads on a victim cell. The controller may be configured to store measured victim information from the plurality of reads on the victim cell. The controller may be configured to perform one or more reads on a plurality of aggressor cells. The controller may be configured to store measured aggressor information from the one or more reads on the plurality of aggressor cells. The controller may be configured to generate inter-cell interference parameters based on the measured victim information and the measured aggressor information. The controller may be configured to mitigate inter-cell interference based on the inter-cell interference parameters.

20 Claims, 8 Drawing Sheets

INTER-CELL INTERFERENCE ESTIMATION BASED ON A PATTERN DEPENDENT HISTOGRAM

FIELD OF THE INVENTION

The invention relates to data storage generally and, more particularly, to a method and/or apparatus for implementing inter-cell interference estimation based on a pattern dependent histogram.

BACKGROUND

Inter-cell interference (ICI) is a data-dependent noise and is detrimental to the reliability of data stored in flash memory. To mitigate/cancel ICI, conventional approaches often use the amount of interference caused by the programming of aggressor cells to be determined/estimated as interference parameters under an ICI model. These interference parameters may be estimated offline by measuring voltage threshold distributions of the victim cells conditioned upon aggressor patterns. Estimation can be done through dedicated characterization procedures of the flash where the estimated parameters are then configured as a set of static values in a system for ICI mitigation. However, ICI parameters may vary throughout the life of a solid state drive (SSD). Furthermore, ICI parameters may vary across different pages/blocks/dies of flash memory. A set of pre-defined ICI parameters may not provide optimal results.

It would be desirable to implement a method for estimating interference parameters on-demand to mitigate ICI.

SUMMARY

The invention concerns an apparatus comprising a memory and a controller. The memory may be configured to process a plurality of read/program operations. The memory may comprise a plurality of memory units each having a size less than a total size of the memory. The controller may be configured to perform a plurality of reads on a victim cell. The controller may be configured to store measured victim information from the plurality of reads on the victim cell. The controller may be configured to perform one or more reads on a plurality of aggressor cells. The controller may be configured to store measured aggressor information from the one or more reads on the plurality of aggressor cells. The controller may be configured to generate inter-cell interference parameters based on the measured victim information and the measured aggressor information. The controller may be configured to mitigate inter-cell interference based on the inter-cell interference parameters.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing inter-cell interference estimation based on a pattern dependent histogram that may (i) be triggered on-demand, (ii) be configured to mitigate/cancel ICI interference, (iii) handle variations in ICI that occur throughout the lifetime of flash memory, (iv) handle variations in ICI that occur across physical locations of flash memory, (v) eliminate the need to implement offline ICI characterization of ICI and/or (vi) be implemented as one or more integrated circuits.

A NAND flash memory cell stores charge on a floating gate (or the trapping layer) of a transistor. Depending on a charge amount, a threshold voltage (e.g., Vt) of the transistor may vary. By "programming" the cell, the floating gate charge amount is changed. The amount the floating gate is charged may represent a certain amount of information to be stored in a non-volatile fashion. To read the information from the cell, a reference voltage (e.g., Vref or Vread) is applied to the control gate. If the reference voltage Vref is higher than the threshold voltage Vt, the transistor is turned on, otherwise the transistor is turned off. The information stored in the cell is detected by sensing a current flowing through the channel of the transistor.

Inter-cell interference (ICI) refers to a phenomenon that the threshold voltage Vt of a flash memory cell (e.g., a victim cell) has interference from some adjacent cells (e.g., aggressor cells) being programmed. The cause of the ICI may be a parasitic capacitance between the cells. In flash memory, parasitic capacitance exists surrounding the floating gate of the cell. As the density of flash memory increases (e.g., a smaller cell size), parasitic capacitances may not be negligible. The threshold voltage Vt of the victim cell may be coupled by the threshold voltage changes of the adjacent aggressor cells.

Figure 1:
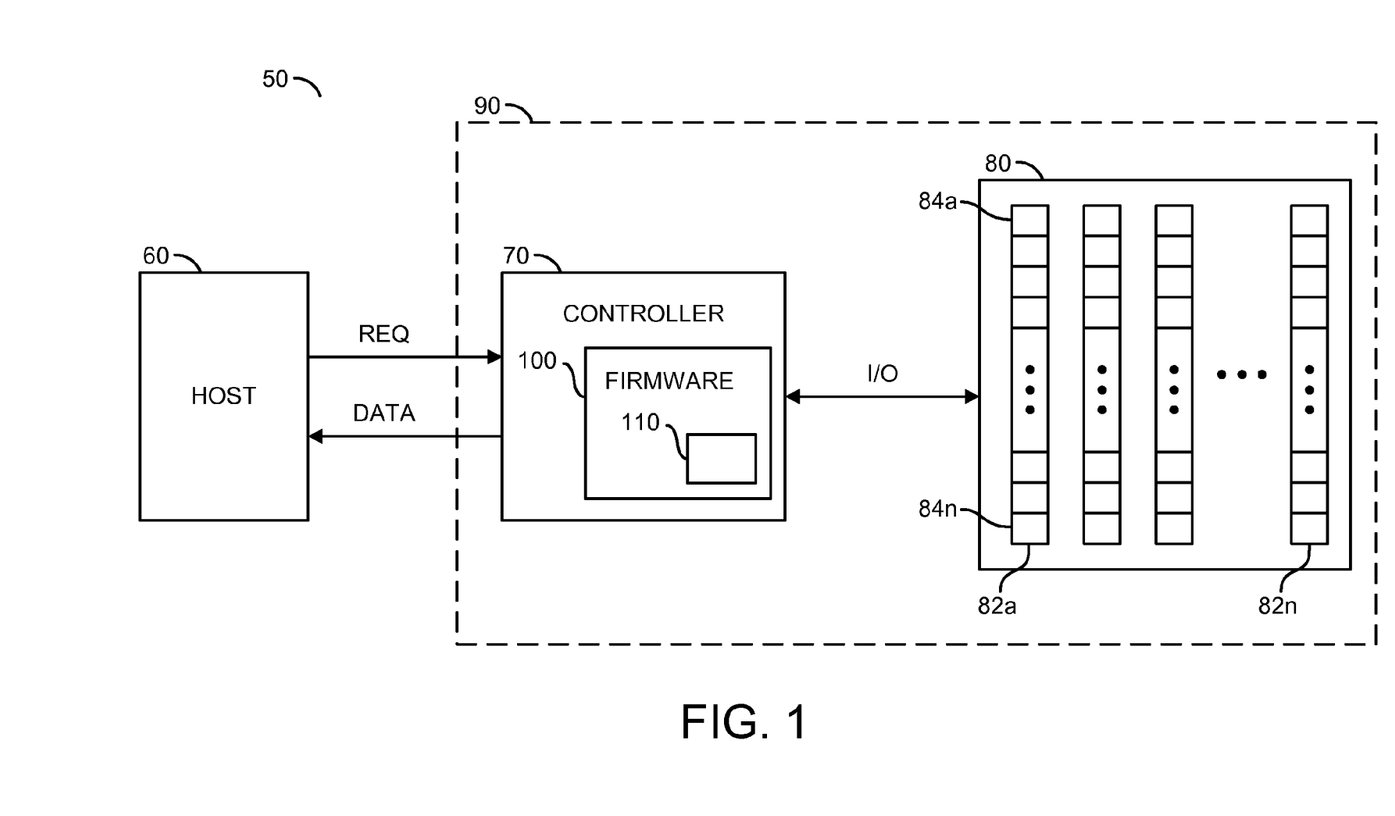
FIG. 1 is a diagram illustrating an example embodiment.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units, such as die, plane, block, and/or page units. The circuit 80 may contain multiple dies (e.g., in a single package or multiple packages). Generally, for enterprise applications the circuit 80 may be comprised of hundreds of flash memory dies. Flash memory may have multiple planes in the same die. The planes may be accessed in parallel to improve performance.

A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. A SLC type circuit generally stores a single bit per memory cell (e.g., a logical 0 or 1). In other embodiments, the circuit 80 may be implemented as a multi-level cell (e.g., MLC) type circuit. A MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111). In yet another embodiment, the circuit 80 may implement a circuit with a cell level greater than a triple-level cell. Generally, the circuit 80 may be implemented as an n-bits-per-cell flash memory capable of storing n-bits per memory cell.

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

The drive 90 may contain, in one example, multiple NAND Flash or memory modules 82a-82n. Each of the memory modules 82a-82n may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of planes. Each of the planes of the dies 82a-82n may contain a plurality of blocks 84a-84n. The blocks 84a-84n of the planes of one of the dies 82a-82n may be accessed in parallel. If the SSD 90 receives the host command REQ, in order to achieve the best performance, and/or to address wear leveling issues, the drive 90 will walk through all of the dies 82a-82n (e.g., a first page of DIE0, DIE1 . . . DIEn, then a next page of DIE0).

Figure 2:
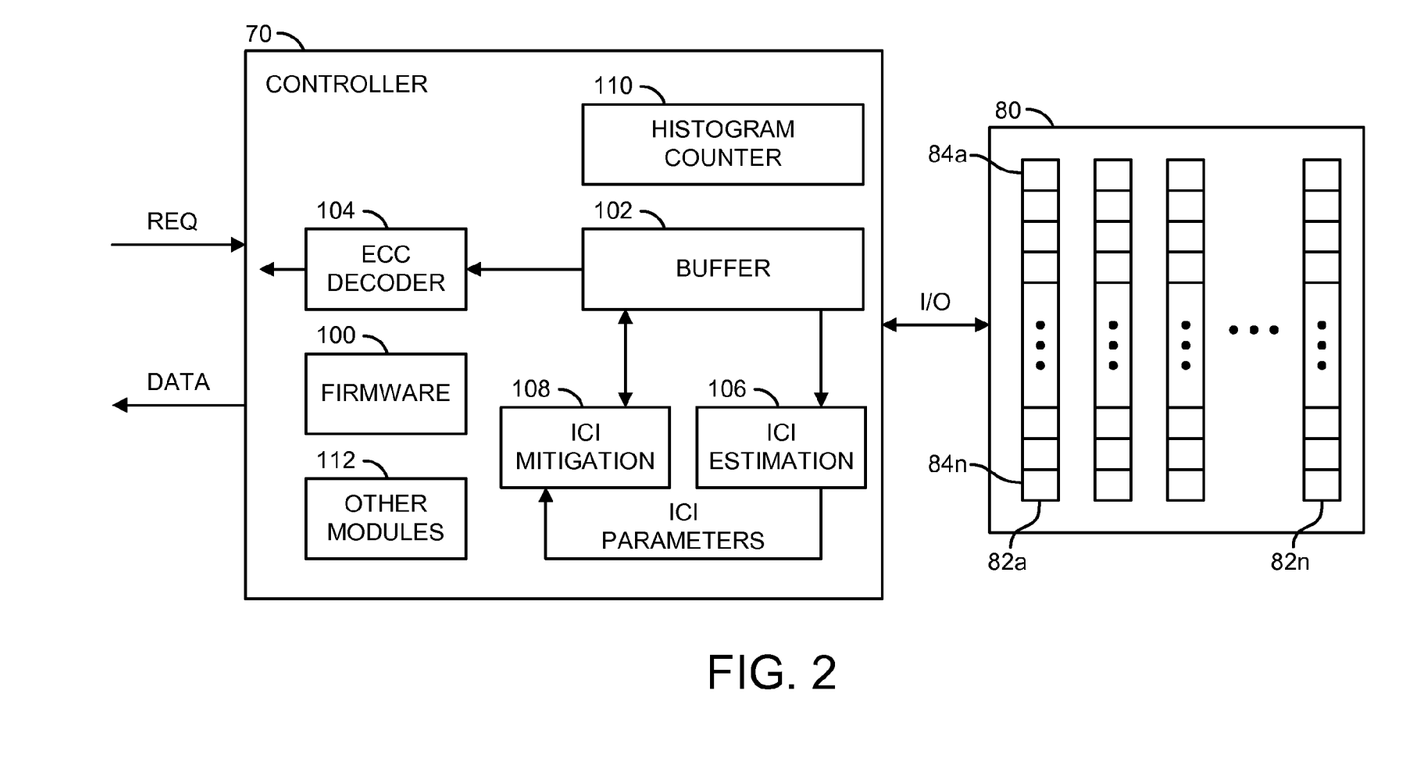
FIG. 2 is a diagram illustrating a more detailed embodiment.

Referring to FIG. 2, a diagram illustrating a more detailed embodiment is shown. The controller 70 is shown connected to the memory circuit 80. The controller 70 generally comprises the firmware 100, a block (or circuit) 102, a block (or circuit) 104, a block (or circuit) 106, a block (or circuit) 108, a block (or circuit) 110, and a block (or circuit) 112. The circuit 102 may be a buffer. The circuit 104 may be an ECC decoder. The circuit 106 may be an ICI estimation module. The circuit 108 may be an ICI mitigation module. The circuit 110 may be a histogram counter. The circuit 112 may represent other modules. The controller 70 may implement ICI estimation and mitigation and/or cancellation. To estimate and/or mitigate ICI, multiple reads may be issued to the same victim page and/or word line.

The buffer 102 may store soft information for cells in a word line. Generally, multiple read operations may be issued on the same victim page and/or word line. The buffer 102 may store "measured" and soft information for the cells in the word line. Aggressor pages may be read to gather information. The buffer 102 may present the stored information from victim page reads and/or aggressor page reads to the ICI estimation module 106.

The ECC decoder 104 may be configured to perform error correction code decoding. The ECC decoder 104 may be configured to perform ECC decoding with soft decoding capability. Generally, the ECC decoder 104 is implemented using digital circuits. For example, the decoder 104 may be configured to decode low density parity check codes. Error correction codes with soft decoding capability may need soft input in the form of log likelihood ratios (LLRs). The ECC decoder 104 may have an input precision (e.g., O-bits, 3-bits, etc.).

The ICI estimation module 106 may determine ICI parameters. The ICI estimation module 106 may receive input from the buffer 102. The results of the estimation performed by the ICI estimation module 106 may be ICI parameters. The ICI parameters may be presented to the ICI mitigation module 108.

The ICI mitigation module 108 may mitigate and/or cancel ICI. The ICI mitigation module 108 may receive input from the ICI estimation module 106. The input may be comprised of the ICI parameters. The ICI mitigation module 108 may output soft-decision and/or hard-decision data. In some embodiments, the output of the ICI mitigation module 108 may be presented to the buffer 102 and then to the ECC decoder 104. In other embodiments, the output of the ICI mitigation module 108 may be presented to the ECC decoder 104.

The histogram counter 110 may store decision pattern histograms. The controller 70 may read a page. After a page read, there may be a decision pattern for each cell of the page. The occurrences of decision patterns may be counted. A histogram may be obtained from the decision patterns. The histogram counter 110 may progressively gain knowledge of voltage distributions during retry reads. Using the updated knowledge, LLR values used for successive reads may be optimized.

In some embodiments, the histogram counter 110 may store histogram data based on multiple pages. The histogram data may be aggregated as more pages are read. In some embodiments, the firmware 100 may collect histogram statistics. For example, the histogram counter 110 may be implemented in the firmware 100. In another example, the histogram counter 110 may be implemented in hardware (e.g., logic such as a state machine).

Figure 3:
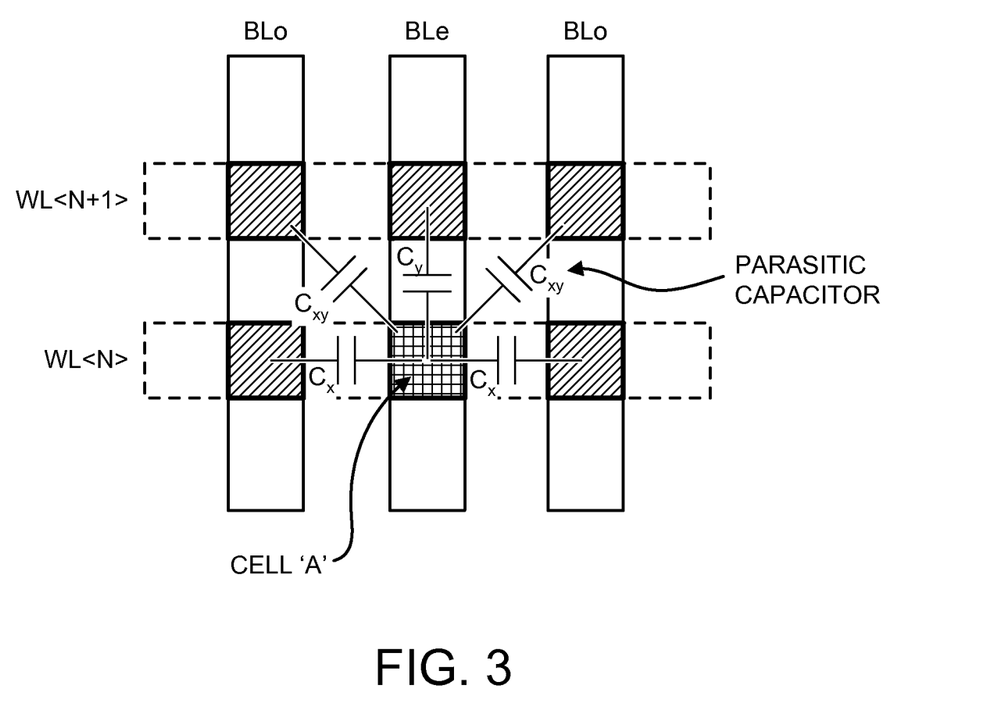
FIG. 3 is a diagram illustrating an example of inter-cell interference.

Referring to FIG. 3, an example of inter-cell interference is shown. The cell array may be comprised of word lines (e.g., WL<N> and WL<N+1>) and bit-lines (e.g., BLo, and BLe). Cell A may be the victim cell. The victim cell (e.g., Cell A) may suffer interference from adjacent cells that are programmed (e.g., the aggressor cells). The victim cell is shown suffering interferences from five adjacent cells.

The interference may be caused by a parasitic capacitance (e.g., $C_X$, $C_Y$, and/or $C_Z$). The victim cell may suffer interference when aggressor cells are programmed after the victim cell. The interference pattern may be related to a programming sequence. For example, the interference suffered by the victim cell may vary based on the order in which the aggressor cells are programmed. The threshold voltage Vt of the victim cell may increase when the aggressor cells are programmed. The change of the threshold voltage Vt of the victim cell may correlate with the changes of the threshold voltage Vt of the aggressor cells.

ICI may be a data-dependent noise. The ICI may be detrimental to the reliability of data stored in the flash memory 80. Generally, to mitigate and/or cancel the ICI, the amount of interference caused by the programming of the aggressor cells may need to be determined and/or estimated.

A mathematical model of ICI may be formed. The distribution of the threshold voltage Vt of a given victim cell state may be modeled as a Gaussian distribution conditioned upon aggressor cell states. For example, an ICI model may consider MLC flash memory and one aggressor cell. The distribution of the threshold voltage Vt of all of the victim cells within a word line may be a mixture of all of the 4 conditional Gaussian distributions.

The difference between the mean of the victim distribution of the threshold voltage Vt with the aggressor pattern "01" and the mean of the overall distribution may be defined as $\Delta\_01$. Similarly, $\Delta\_11$, $\Delta\_00$, and $\Delta\_10$ may be defined. The mean differences in the threshold voltage Vt (e.g., $\Delta\_01$, $\Delta\_11$, $\Delta\_00$, and $\Delta\_10$) may be one or more interference amounts used as parameters (e.g., interference parameters) under an ICI model. For another example of a model that accounts for 2 MLC aggressor cells, the number of aggressor patterns may be 4^2=16.

In conventional embodiments, the interference parameters may be estimated offline by measuring distributions of the threshold voltage Vt of the victim cells conditioned upon aggressor patterns. The offline measuring may be performed utilizing dedicated characterization procedures of flash memory. The estimated parameters may be configured as a set of static values in a system for ICI mitigation. For example, the ICI characterization may be performed prior to manufacturing. However, the ICI parameters may vary throughout the life of a drive. Furthermore, the ICI parameters may vary across different pages/blocks/dies (e.g., memory units) of the flash memory. ICI parameters that cannot be determined on-demand may not provide optimal ICI mitigation.

Figure 4:
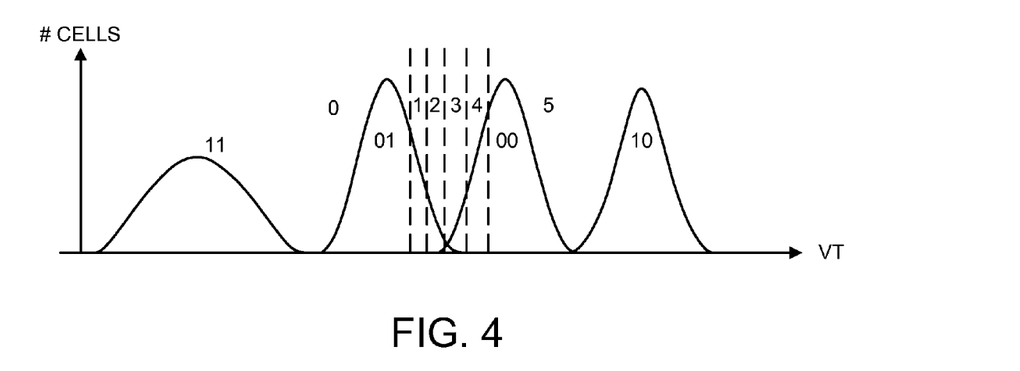
FIG. 4 is a diagram illustrating decision regions for a soft read operation on a lower page of flash memory.

Referring to FIG. 4, decision regions for a soft read operation on a lower page of flash memory is shown. Five hard-decision reads on the lower page are shown having different Vrefs. The range of the threshold voltage Vt (e.g., the x-axis) may be divided into six decision regions by the five values of the reference voltages Vrefs. The six decision regions may have an index (e.g., an S-index) ranging from 0 to 5. Without knowing genie data of the lower page, it may be possible to obtain a histogram of the threshold voltage Vt. The histogram may be the number of cells in each decision region given the 5 reads (e.g., using the various reference voltages Vrefs).

Generally, genie data may be binary bits written to a flash media. In conventional flash media, the genie data may not be available unless the ECC decoding is successful. When a page is read from flash, the read data may contain some erroneous bits. However, which bits are erroneous may not be known. Since the erroneous bits are not known, the genie data is not known. The ECC decoding process may correct the erroneous bits so that the genie data may be known.

Histograms may be generated by the histogram counter unit 110 (e.g., in hardware and/or software) for a number of reads N (N>1). Generally, a single histogram may not be sufficient for the ICI estimation module 106 to estimate the ICI parameters. The single histogram (e.g., the histogram generated from the victim cell) may not be sufficient because there is no aggressor pattern dependent information (e.g., histograms generated from the aggressor cells).

Figure 5:
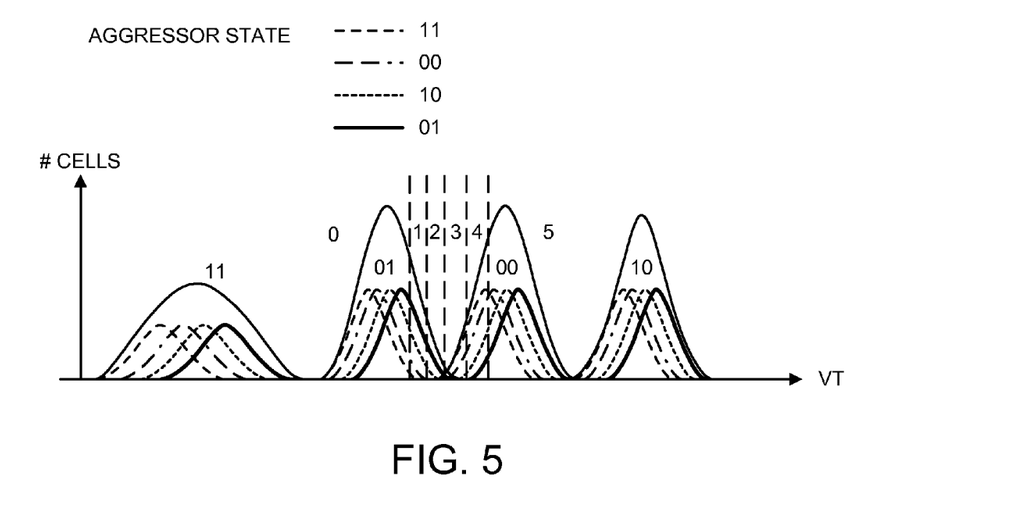
FIG. 5 is a diagram illustrating decision regions for a soft read operation on a lower page of flash memory when an aggressor word line is also read.

Referring to FIG. 5, decision regions for a soft read operation on a lower page of flash memory when an aggressor word line is also read is shown. The same ICI model described in FIG. 4 is used to show MLC flash having 4 distributions of the threshold voltage Vt for the 4 states of one aggressor cell. The overall and the aggressor pattern dependent distributions may be determined. To estimate the ICI parameters, the analog values of the threshold voltage Vt for each aggressor cell may be needed. ICI may be estimated based on pattern-dependent histograms on the victim page and/or word line.

The same 5 reads described in FIG. 4 may generate a pattern-dependent histogram if the aggressor word line (e.g., the word line comprising the aggressor cells) is also read. For an example using a MLC aggressor word line, two hard-decision reads may be performed (e.g., one lower page read and one upper page read). The pattern-dependent histogram counter 110 may generate pattern-dependent histograms.

Figure 6:
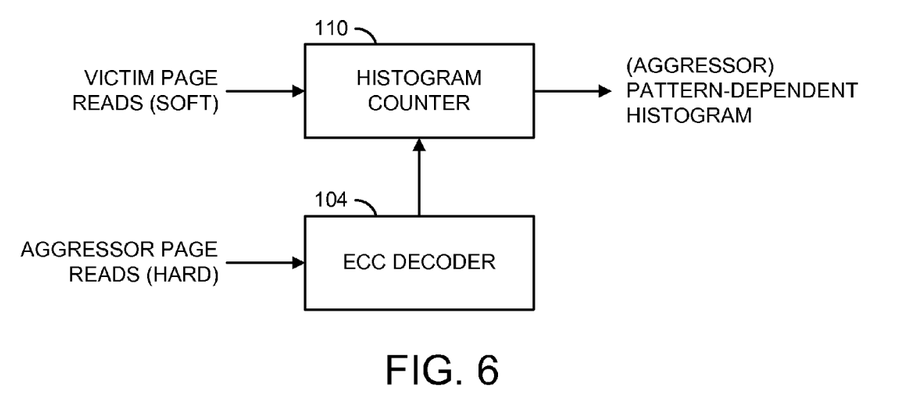
FIG. 6 is a diagram illustrating a histogram counter generating pattern-dependent histograms based on victim and aggressor reads.

Referring to FIG. 6, the histogram counter 110 generating pattern-dependent histograms based on victim and aggressor reads is shown. The histogram counter 110 may generate pattern-dependent histograms from both victim page reads (e.g., soft-decision data) and aggressor page reads (e.g., hard-decision data). The histogram counter 110 may generate an overall (e.g., pattern-independent) histogram. In one example, an overall histogram counter may be embedded in the histogram counter module 110. In another example, the controller 70 may sum up all the pattern-dependent histograms over all aggressor patterns to generate the overall histogram.

The ECC decoder 104 may be optional for the aggressor page reads. Generally, successfully decoded output may be more accurate in providing aggressor cell state information. For example, the aggressor cell state information may be successfully decoded by the ECC decoder 104 and then presented to the histogram counter 110. However, hard-decision reads on a MLC flash page generally have no more than 1% bits in error. In another example where the aggressor cell state information is not decoded by the ECC decoder 104, the impact on the histogram statistics may not be significant.

Pattern-dependent histograms may be generated from page reads of victim pages (e.g., soft-decision data) and/or reads from aggressor pages (e.g., hard-decision data). Histograms may correspond to possible states of the aggressor cells. The histogram may only cover the cross-point Vt region between a victim state "01" and a victim state "00". A simplified ICI model may be implemented. A value P may be defined as the aggressor pattern. The simplified ICI model may be implemented such that $\Delta\_P$ may be the same for the victim state "01" and the victim state "00".

The simplified ICI model may be implemented so that two different interference amounts are not estimated based on one histogram. The simplified ICI model may be implemented so that errors are mostly caused by the intersection of the Vt distributions from the two adjacent states. Generally, the simplification in the simplified ICI model (e.g., from 2 different pattern-dependent mean shifts to 1 shift in a cross-point region) captures most of the ICI information to be used in ICI mitigation.

The simplified ICI model may be extended to an upper page in MLC flash memory and/or pages in TLC flash memory. For example, if the victim page is an upper page in MLC flash memory, two interference values may be estimated (e.g., $\Delta\_AP$ and $\Delta\_CP$). $\Delta\_AP$ may be the interference on the Vt region between the states "11" and "01". $\Delta\_CP$ may be the interference on the Vt region between the states "00" and "10". Correspondingly, the pattern-dependent histograms for upper pages may have two regions.

The value $\Delta\_P$ may be estimated from pattern-dependent histograms and the overall histogram. The particular method for estimating the value $\Delta\_P$ may be varied based on the design criteria of a particular implementation. Generally, a greater number of reads performed on the victim page may provide a more accurate estimation. In some example embodiments, the lowest point in the histograms may be used to estimate interference. The lowest points in each histogram may be estimated. The value $\Delta\_P$ may be determined by subtracting the value of the threshold voltage Vt corresponding to the lowest point from each pattern-dependent histogram. For example, the value of the threshold voltage Vt corresponding to the lowest point in the overall histogram may be subtracted from the value of the threshold voltage Vt corresponding to the lowest point in each of the aggressor pattern-dependent histograms (e.g., based on the aggressor state "11", the aggressor state "01", the aggressor state "00", and the aggressor state "10"). An example of estimating interference from the histograms is shown in the following TABLE 1 below:

TABLE 1

| | Aggressor pattern (P) | | | | |
|---|---|---|---|---|---|
| | Overall | "11" | "01" | "00" | "10" |
| Lowest point in histogram (V) | 1.70 | 1.70 | 1.80 | 1.75 | 1.80 |
| Interference $\Delta\_P$ (V) | N/A | 0 | 0.1 | 0.05 | 0.1 |

The ICI estimation based on pattern-dependent histograms may eliminate the need for offline characterization of ICI. The ICI estimation based on pattern-dependent histograms may handle ICI variation among physical locations and/or throughout the life of the drive 90. The ICI estimation based on pattern-dependent histograms may be performed on-demand in retry (e.g., retry decoding attempts) to further lower a failure rate of ICI cancellation. For example, the ICI estimation may be performed after manufacturing and/or invoked during the lifetime of the drive 90.

ICI estimation and/or cancellation may be invoked in retry. For example, a soft-read retry may be implemented. Soft-read retry may be implemented due to the scaling down (e.g., increased density of flash memory cells) and/or decreased reliability of flash memory. In some embodiments, soft reads on the victim page may be reused in ICI estimation and/or cancellation. Reusing the soft reads on the victim page may minimize time spent in ICI estimation. Additional reads may be issued before ICI estimation to increase precision and/or accuracy.

Figure 7:
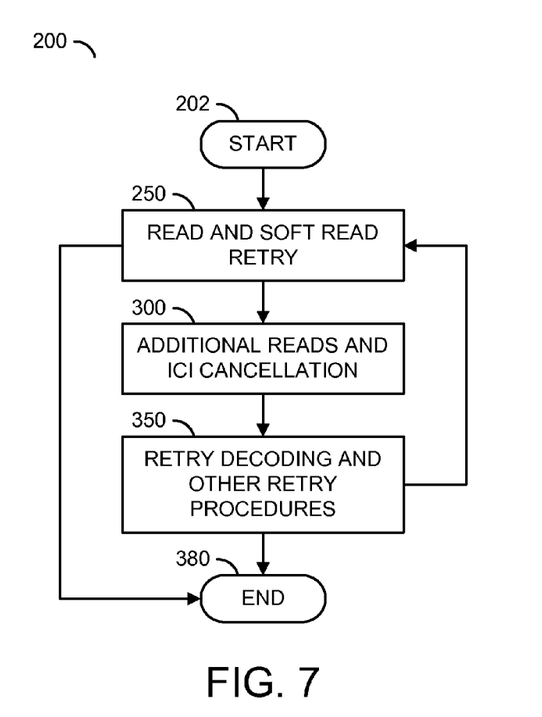
FIG. 7 is a flow diagram illustrating retry decoding with ICI estimation.

Referring to FIG. 7, a method (or process) 200 is shown. The method 200 may implement retry decoding with ICI estimation. The method 200 generally comprises a step (or state) 202, a step (or state) 250, a step (or state) 300, a step (or state) 350, and a step (or state) 380. The state 202 may start the method 200. The state 250 may implement a method (or process) for a read and soft read retry (as described below in FIG. 8). Based on the results of the method 250, the method 200 may move to the state 380, which ends the method 200 or the method 200 may move to the state 300. The state 300 may implement a method (or process) for additional reads and ICI cancellation (as described below in FIG. 9). Next, the method 200 moves to the state 350. The state 350 may implement a method (or process) for retry decoding and other retry procedures (as described below in FIG. 10). Based on the results of the method 350, the method 200 may move to the state 380, which ends the method 200 or the method 200 may return to the state 250.

Figure 8:
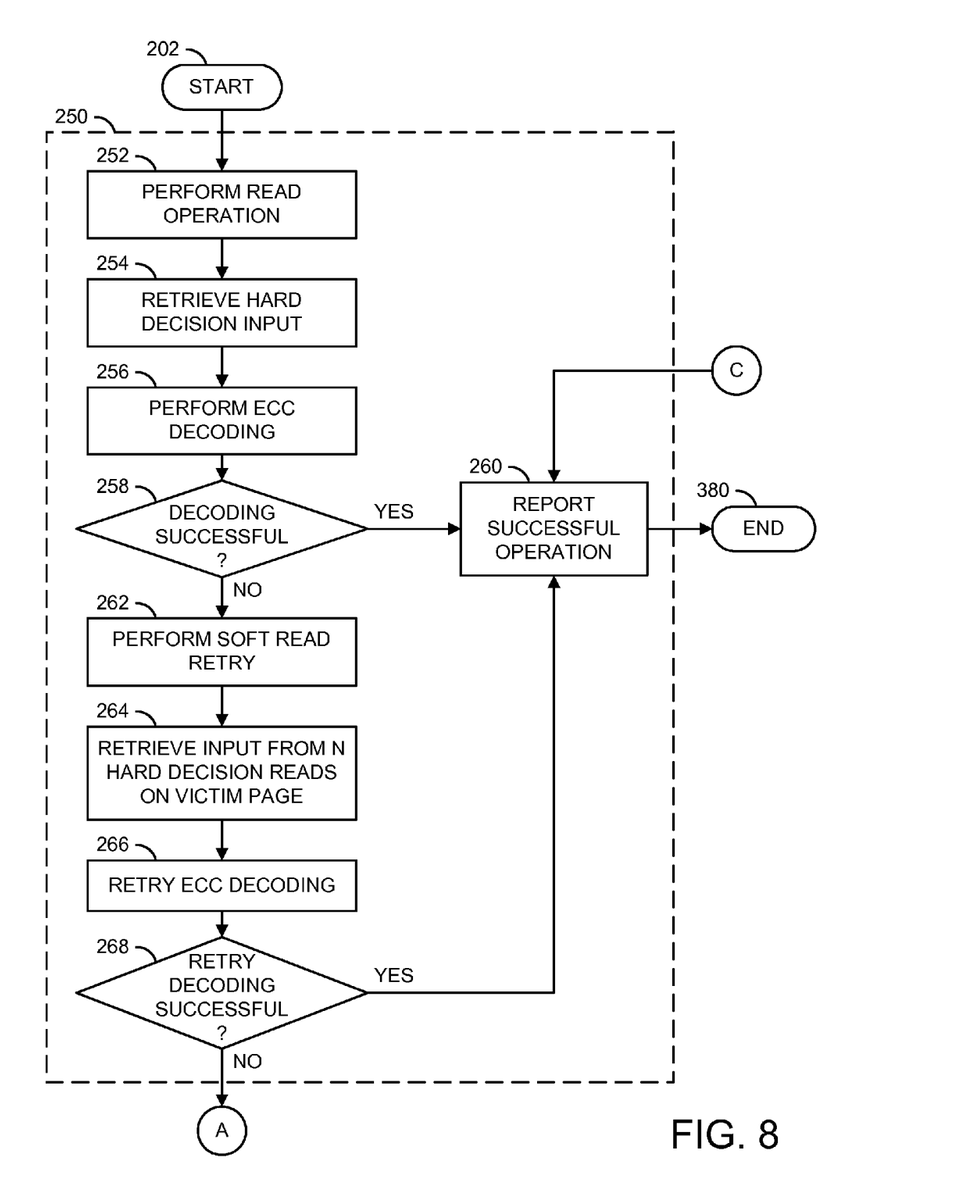
FIG. 8 is a flow diagram illustrating a read and soft read retry.

Referring to FIG. 8, details of the method 250 are shown. The method 250 may implement a read and soft read retry. The method 250 generally comprises a step (or state) 252, a step (or state) 254, a step (or state) 256, a decision step (or state) 258, a step (or state) 260, a step (or state) 262, a step (or state) 264, a step (or state) 266, and a decision step (or state) 268. The state 252 may perform a read operation. Next, the state 254 may retrieve hard decision input (e.g., information from a hard decision read). The state 256 may perform ECC decoding. Next, the method 250 moves to the decision state 258.

If the decision state 258 determines the decoding is successful, the method 250 moves to the state 260. The state 260 may report a successful operation. Next, the method 250 moves to the state 380 (as described in FIG. 7), which ends the method 250 and the global method 200. If the decision state 258 determines the decoding is not successful, the method 250 moves to the state 262. The state 262 may perform a soft read retry. Next, the state 264 may retrieve input from N hard decision reads on the victim page. The number of hard decision reads may vary based on the design criteria of a particular implementation. The state 266 may retry ECC decoding. Next, the method 250 moves to the decision state 268. If the decision state 268 determines the retry decoding is successful, the method 250 moves to the state 260. If not, the method 250 moves to the additional reads and ICI cancellation method 300.

Generally, a soft read may generate soft (e.g., decision region) information for each cell within a memory unit (e.g., a page, codeword, etc.). For example, a soft read may be implemented as multiple hard decision reads performed using different reference voltages. In another example, there may be a built-in soft read command (e.g., a flash memory may implement a soft read command). The type of soft read method may be varied according to the design criteria of a particular implementation.

In some embodiments, the controller 70 may re-use the soft read information (e.g., in the state 264) from the soft read retry step (e.g., the state 262). In another example embodiment, the controller 70 may not implement a soft ECC decoder (e.g., only hard decision retry may be implemented). In an embodiment that does not implement a soft ECC decoder, the retry step (e.g., the state 262) may be implemented as hard decision retries, and the hard decision retries may be re-used along with any additional hard decision reads (e.g., in the state 264).

Figure 9:
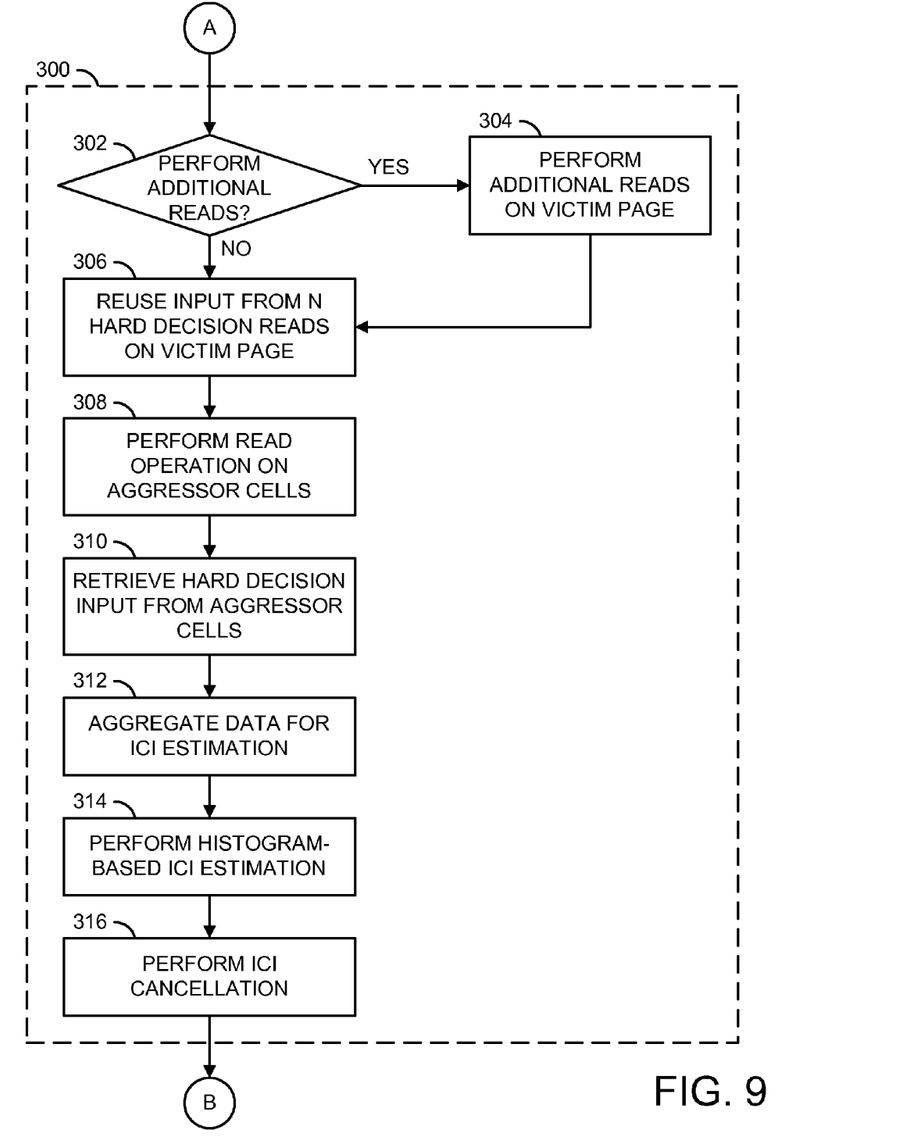
FIG. 9 is a flow diagram illustrating additional reads and ICI cancellation.

Referring to FIG. 9, details of the method 300 are shown. The method 300 may implement additional reads and ICI cancellation. The method 300 generally comprises a decision step (or state) 302, a step (or state) 304, a step (or state) 306, a step (or state) 308, a step (or state) 310, a step (or state) 312, a step (or state) 314, a step (or state) 314, and a step (or state) 316.

The decision state 302 may determine whether to perform additional reads. If so, the method 300 moves to the state 304. If not, the method 300 moves to the state 306. The state 304 may perform additional reads on the victim page. The number of additional reads may vary according to the design criteria of a particular implementation. Next, the method 300 moves to the state 306. The state 306 may reuse the input from the N hard decision reads on the victim page. Next, the state 308 may perform a read operation on aggressor cells. Next, the method 300 moves to the state 310.

Figure 10:
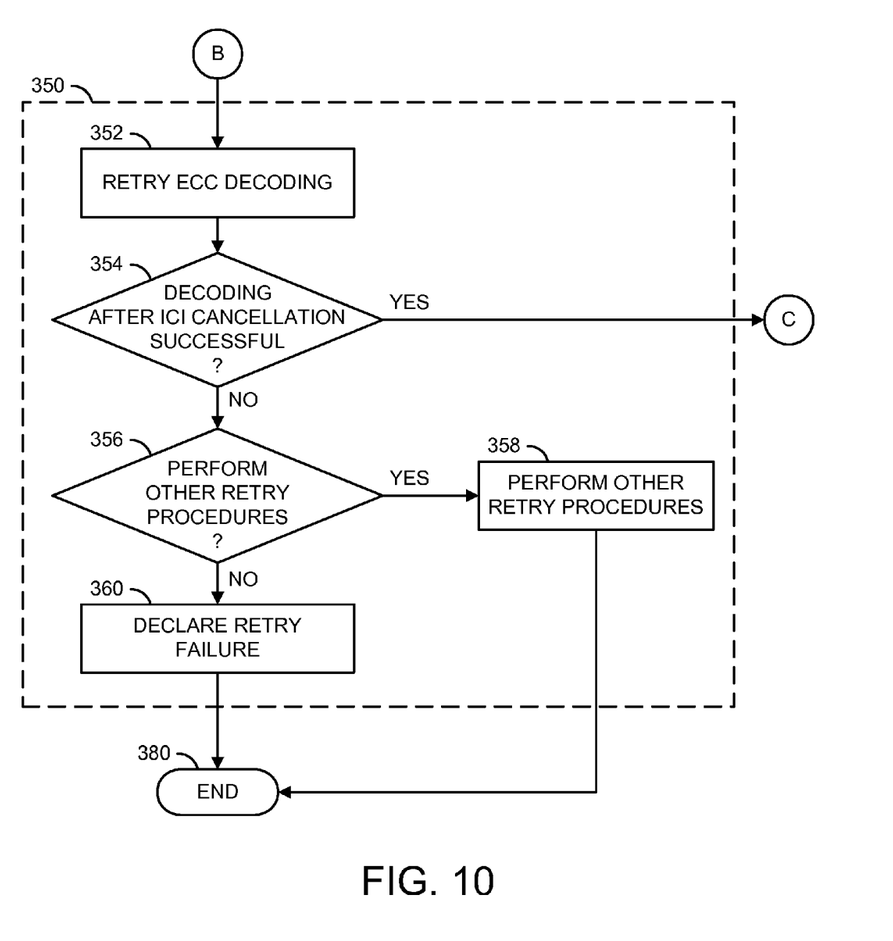
FIG. 10 is a flow diagram illustrating retry decoding and other retry procedures.

The state 310 may retrieve hard decision input from aggressor cells (e.g., information from hard decision reads performed on the aggressor cells). The number of reads on the aggressor cells may vary according to the design criteria of a particular implementation. Next, the state 312 may aggregate data for ICI estimation. The state 314 may perform histogram-based ICI estimation (e.g., in the ICI estimation module 106). The state 316 may perform ICI cancellation and/or mitigation (e.g., in the ICI mitigation module 108). Next, the method 300 moves to the retry decoding and other retry procedures method 350.

Referring to FIG. 10, details of the method 350 are shown. The method 350 may implement retry decoding and other retry procedures. The method 350 generally comprises a step (or state) 352, a decision step (or state) 354, a decision step (or state) 356, a step (or state) 358, and a step (or state) 360.

The state 352 may retry ECC decoding. Next, the method 350 moves to the decision state 354. If the decision state 354 determines decoding after ICI cancellation is successful, the method 350 ends and the method 200 returns to the method 250 (e.g., and subsequently the state 260). If the decision state 354 determines decoding after ICI cancellation is not successful, the method 350 moves to the decision state 356.

If the decision state 356 determines to perform other retry procedures, the method 350 moves to the state 358. The state 358 may perform other retry procedures. Next, the method 350 moves to the state 380 (as described in FIG. 7), which ends the method 350 and the global method 200. If the decision state 356 determines not to perform other retry procedures, the method 350 moves to the state 360. The state 360 may declare retry failure. Next, the method 350 moves to the state 380 (as described in FIG. 7), which ends the method 350 and the global method 200.

The controller 70 may be configured to perform inter-cell interference estimation based on aggressor pattern-dependent histograms. The aggressor pattern-dependent histograms may be generated based on multiple reads on victim pages and hard-decision reads on aggressor pages. In some embodiments, one read of the aggressor page may be sufficient. For example, some flash memory may be implemented having one or more SLC pages in an MLC block. A single hard-decision read may be sufficient on the aggressor word line of the MLC page that precedes the SLC page (e.g., precedes in programming sequence).

The inter-cell interference estimation implemented by the controller 70 may be used in lieu of ICI characterization. The inter-cell interference estimation implemented by the controller 70 may handle ICI variation across physical locations and/or throughout the life of the drive 90. The inter-cell interference estimation implemented by the controller 70 may be triggered on-demand to improve read retry on the flash memory 80.

The functions performed by the diagrams of FIGS. 7-10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a memory configured to store data, the memory comprising a plurality of memory units each having a size less than a total size of the memory; and
   a controller configured to (A) process a plurality of read/program operations and (B) (i) perform a plurality of reads on a victim cell, (ii) store measured victim information from the plurality of reads on the victim cell, (iii) perform one or more reads on a plurality of aggressor cells, (iv) store measured aggressor information from the one or more reads on the plurality of aggressor cells, (v) generate inter-cell interference parameters based on the measured victim information and the measured aggressor information, and (vi) mitigate inter-cell interference based on the inter-cell interference parameters.

2. The apparatus according to claim 1, wherein the measured victim information and the measured aggressor information comprises a histogram of decision regions.

3. The apparatus according to claim 1, wherein the controller calculates the inter-cell interference parameters after manufacturing to avoid inter-cell interference characterization prior to manufacturing.

4. The apparatus according to claim 1, wherein the controller measures inter-cell interference variations across physical locations of the memory units.

5. The apparatus according to claim 1, wherein the controller measures inter-cell interference variations throughout a lifetime of the apparatus.

6. The apparatus according to claim 1, wherein the controller triggers on-demand calculation of the inter-cell parameters.

7. The apparatus according to claim 1, wherein the controller further comprises an inter-cell interference mitigation module.

8. The apparatus according to claim 7, wherein an output of the inter-cell interference mitigation module is soft-decision data.

9. The apparatus according to claim 7, wherein an output of the inter-cell interference mitigation module is hard-decision data.

10. The apparatus according to claim 1, wherein the controller further comprises a histogram counter unit, wherein the histogram counter unit generates a plurality of histograms.

11. The apparatus according to claim 10, wherein the histogram counter unit is configured to generate an overall histogram.

12. The apparatus according to claim 1, wherein the controller sums pattern-dependent histograms over all aggressor patterns to generate an overall histogram.

13. The apparatus according to claim 1, wherein the controller further comprises an error correcting code decoder configured to provide aggressor cell state information.

14. The apparatus according to claim 1, wherein the plurality of reads of the victim cell comprises soft reads.

15. The apparatus according to claim 14, wherein the soft reads are reused in the generation of the inter-cell interference parameters.

16. The apparatus according to claim 1, wherein a plurality of additional reads are issued before the generation of the inter-cell interference parameters to increase precision.

17. The apparatus according to claim 1, wherein the apparatus is configured to implement inter-cell interference estimation based on a pattern-dependent histogram.

18. A method for implementing inter-cell interference estimation, comprising the steps of:
   (A) processing a plurality of read/program operations to/from a memory, the memory comprising a plurality of memory units each having a size less than a total size of the memory;
   (B) performing a plurality of reads on a victim cell;
   (C) storing measured victim information from the plurality of reads on the victim cell;
   (D) performing one or more reads on a plurality of aggressor cells;
   (E) storing measured aggressor information from said one or more reads on the plurality of aggressor cells;
   (F) generating inter-cell interference parameters based on the measured victim information and the measured aggressor information; and
   (G) mitigating the inter-cell interference based on the inter-cell interference parameters.

19. An apparatus comprising:
   an interface configured to process a plurality of read/write operations to/from a memory; and
   a control circuit configured to (i) perform a plurality of reads on a victim cell, (ii) store measured victim information from the plurality of reads on the victim cell, (iii) perform one or more reads on a plurality of aggressor cells, (iv) store measured aggressor information from the one or more reads on the plurality of aggressor cells, (v) generate inter-cell interference parameters based on the measured victim information and the measured aggressor information, and (vi) mitigate inter-cell interference based on the inter-cell interference parameters.

20. The apparatus according to claim 19, wherein the memory and the controller are part of a solid-state drive.

* * * * *